(12) United States Patent
Maxim et al.

(10) Patent No.: US 10,224,891 B2
(45) Date of Patent: Mar. 5, 2019

(54) RADIO FREQUENCY POWER AMPLIFIER WITH NOISE REDUCTION FEEDBACK LINEARIZATION

(71) Applicant: RF Micro Devices, Inc., Greensboro, NC (US)

(72) Inventors: George Maxim, Saratoga, CA (US); Baker Scott, San Jose, CA (US); Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 438 days.

(21) Appl. No.: 14/568,495

(22) Filed: Dec. 12, 2014

(65) Prior Publication Data

US 2015/0171815 A1 Jun. 18, 2015

Related U.S. Application Data

(60) Provisional application No. 61/915,211, filed on Dec. 12, 2013.

(51) Int. Cl.
*H04B 1/04* (2006.01)
*H03G 3/30* (2006.01)
(Continued)

(52) U.S. Cl.
CPC ............ *H03G 3/3042* (2013.01); *H03F 1/26* (2013.01); *H03F 1/3247* (2013.01); *H03F 1/3282* (2013.01); *H03F 3/193* (2013.01)

(58) Field of Classification Search
CPC .................................................... H03G 3/3042
(Continued)

(56) References Cited

U.S. PATENT DOCUMENTS 5,475,255 A * 12/1995 Joardar ................. H01L 23/585
257/394
5,770,971 A * 6/1998 McNicol ............... H03F 1/3235
330/149

(Continued)

OTHER PUBLICATIONS

Bowman, D., "Noise Reduction in Broad Band RF Power Amplifiers Using Phase Lock Techniques," Defense Technical Information Center, Jan. 1972, 35 pages.

(Continued)

*Primary Examiner* — Edward F Urban
*Assistant Examiner* — Rui M Hu
(74) *Attorney, Agent, or Firm* — Withrow & Terranova, P.L.L.C.

(57) ABSTRACT

RF PA circuitry includes an RF signal path, an adjustable component, a distortion compensation feedback loop including distortion compensation circuitry, RF noise filtering circuitry, and baseband noise filtering circuitry. The adjustable component is located in the RF signal path. The distortion compensation feedback loop is coupled in parallel with at least a portion of the RF signal path, and includes the distortion compensation circuitry. Further, the distortion compensation circuitry is configured to adjust one or more parameters of the adjustable component via a component adjustment signal based on a measurement of a signal at an output of the RF signal path. The RF noise filtering circuitry is coupled in the RF signal path and configured to attenuate noise therein. The baseband noise filtering circuitry is coupled between the distortion compensation circuitry and the adjustable component and configured to attenuate noise in the component adjustment signal.

28 Claims, 16 Drawing Sheets

(51) Int. Cl.
*H03F 1/26* (2006.01)
*H03F 1/32* (2006.01)
*H03F 3/193* (2006.01)

(58) Field of Classification Search
USPC .................. 455/127.2, 114.3, 115.1, 126
See application file for complete search history.

(56) References Cited

U.S. PATENT DOCUMENTS

| | | | | |
|---|---|---|---|---|
| 7,702,301 | B2* | 4/2010 | Rabjohn | H03F 1/3247 330/110 |
| 7,783,269 | B2* | 8/2010 | Vinayak | H03F 1/0222 330/136 |
| 7,933,570 | B2* | 4/2011 | Vinayak | H03F 1/0205 455/114.3 |
| 8,030,997 | B2* | 10/2011 | Brown | H03F 1/26 330/136 |
| 8,498,605 | B1* | 7/2013 | Cook | H03D 7/1466 455/325 |
| 2003/0045264 | A1* | 3/2003 | Jeong | H03F 1/3229 455/323 |
| 2004/0140922 | A1* | 7/2004 | Melanson | H03M 3/344 341/144 |
| 2005/0191976 | A1* | 9/2005 | Shakeshaft | H03C 3/40 455/118 |
| 2005/0255825 | A1* | 11/2005 | Takagi | H04B 1/30 455/341 |
| 2007/0004368 | A1* | 1/2007 | Lee | H03D 7/1441 455/323 |
| 2007/0184791 | A1* | 8/2007 | Vinayak | H03F 1/0205 455/127.1 |
| 2008/0287077 | A1* | 11/2008 | Grundlingh | H03F 1/34 455/126 |
| 2009/0156143 | A1* | 6/2009 | Shute | H03G 3/3042 455/127.2 |
| 2010/0105338 | A1* | 4/2010 | Wang | H03F 1/3241 455/73 |
| 2012/0063496 | A1* | 3/2012 | Giannini | H04B 1/0475 375/221 |
| 2013/0137384 | A1* | 5/2013 | Desclos | H04B 1/0475 455/78 |

OTHER PUBLICATIONS

Jeong, Yong-Chae, "A Feedforward Power Amplifier with Loops to Reduce RX Band Noise and Intermodulation Distortion," Microwave Journal, Jan. 1, 2002, http://www.microwavejournal.com/articles/print/3375-a-feedforward-power-amplifier-with-loops-to-reduce-rx-band-noise-and-intermodulation-distortion, 8 pages.

Liu, Lei, et al., "Comparative Study and Analysis of Noise Reduction Techniques for Front-End Amplifiers," 2011 13th International Symposium on Integrated Circuits (ISIC), Dec. 12-14, 2011, pp. 555-558.

Talwar, A.K., "Reduction of Noise and Distortion in Amplifiers Using Adaptive Cancellation," IEEE Transactions on Microwave Theory and Techniques, vol. 42, No. 6, Jun. 1994, pp. 1086-1087.

\* cited by examiner

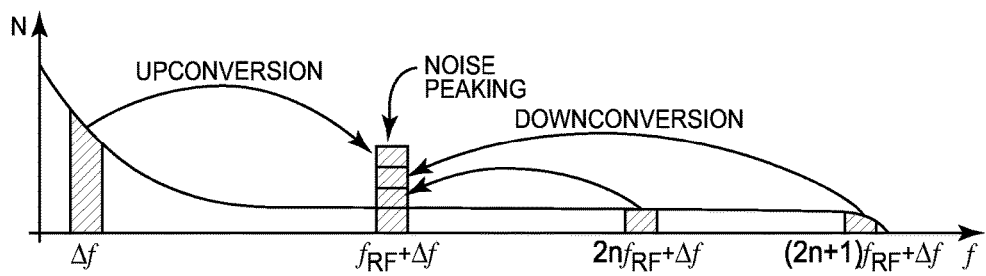
FIG. 5
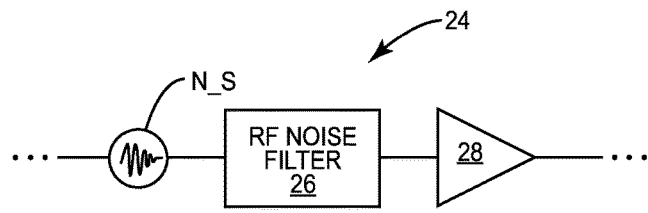
FIG. 6A
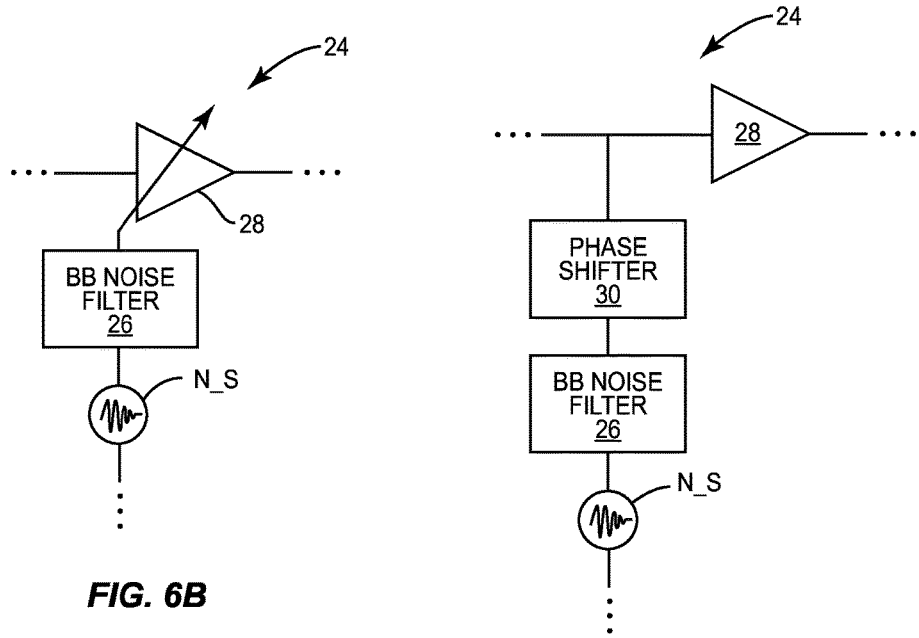
FIG. 6B
FIG. 6C

RADIO FREQUENCY POWER AMPLIFIER WITH NOISE REDUCTION FEEDBACK LINEARIZATION

RELATED APPLICATIONS

This application claims the benefit of U.S. provisional patent application Ser. No. 61/915,211, filed Dec. 12, 2013, the disclosure of which is incorporated herein by reference in its entirety.

FIELD OF THE DISCLOSURE

The present disclosure relates to radio frequency (RF) power amplifiers (PAs), and specifically to RF PAs including noise reduction feedback linearization circuitry.

BACKGROUND

Radio frequency (RF) power amplifiers (PAs) are used in the amplification of RF signals for transmission from a wireless-enabled device. One measure of the quality of an RF PA is the ability of the device to accurately replicate the amplitude of an RF input signal in proportion to a gain of the RF PA. Known as the linearity of the RF PA, this measure determines the amount of amplitude modulation (AM) distortion produced by the device. An additional measure of distortion, known as phase modulation (PM) distortion measures the ability of the RF PA to accurately reproduce the phase of an RF input signal. In an effort to increase the linearity of an RF PA and ensure accurate phase reproduction of an RF input signal provided thereto, conventional solutions have used one or more feedback loops surrounding the device. While generally effective at reducing distortion and thus increasing linearity of a target device, distortion correction or linearization feedback loops often result in increased noise in the RF signal path of the RF PA due to up-conversion and down-conversion of noise. Although there are many well-known noise reduction techniques currently available to designers, they are generally at odds with the operating principles of the distortion correction or linearization feedback loops. That is, while the distortion correction or linearization feedback loops generally require high loop gain and bandwidth to properly function, noise reduction techniques require a low loop gain and bandwidth. Accordingly, the development of low noise RF PAs including distortion correction or linearization feedback loops have been slow to develop, if at all.

FIG. 1 shows a conventional RF PA 10 according to one embodiment of the present disclosure. The conventional RF PA 10 includes an RF input node 12, an RF output node 14, a driver stage amplifier 16, and an output stage amplifier 18. As further shown in FIG. 1, a first noise source N1 is located before the driver stage amplifier 16, while a second noise source N2 is located before the output stage amplifier 18. As will be appreciated by those of ordinary skill in the art, the noise sources N1 and N2 are not actual components but rather visual representations of noise present in the RF signal path between the RF input node 12 and the RF output node 14.

The operation of the conventional RF PA 10 is now discussed with respect to FIGS. 2A through 2C. As discussed above, it is desirable for an RF PA to have a linear gain response over a desired input power range. Absent such a linear response, distortion compensation techniques such as feedback loops must be employed. As shown in FIG. 2A, the driver stage amplifier 16 has a relatively linear gain response over a desired input power range (up to P-MAX). Further, as shown in FIG. 2B, the output stage amplifier 18 also has a relatively linear gain response in the desired input power range. Accordingly, external distortion compensation techniques such as feedback loops may not be necessary for the conventional RF PA 10. FIG. 2C shows a plot of the overall noise for the conventional RF PA 10. Due to the linear gain response thereof, the noise in the conventional RF PA 10 has a relatively flat response that is easily compensated for. Unfortunately, the gain response of the driver stage amplifier 16 and the output stage amplifier 18 shown in FIGS. 2A and 2B, respectively, are generally not achievable in real-world scenarios. Specifically, to achieve these linear gain responses, a large amount of power must be used in the biasing of the driver stage amplifier 16 and the output stage amplifier 18, thereby degrading the efficiency of the conventional RF PA 10. Further, other non-ideal operating characteristics may skew the gain response of either the driver stage amplifier 16 or the output stage amplifier 18, thereby requiring external intervention.

FIG. 3 shows the conventional RF PA 10 including distortion compensation circuitry 20. As shown in FIG. 3, the distortion compensation circuitry 20 is coupled in a feedback and/or feedforward configuration such that a signal at both the RF input node 12 and the RF output node 14 are delivered to the circuitry. Further, the distortion compensation circuitry 20 is coupled to the driver stage amplifier 16, which is a variable gain amplifier, and a phase shifter 22 coupled to the RF signal path. A third noise source N3 is shown between the distortion compensation circuitry 20 and the driver stage amplifier 16, and a fourth noise source N4 is shown between the distortion compensation circuitry 20 and the phase shifter 22.

The operation of the conventional RF PA 10 shown in FIG. 3 is now discussed with respect to FIGS. 4A through 4C. As shown in FIG. 4B, the gain response of the output stage amplifier 18 is relatively flat up to a certain input power (labeled $P_{NL}$, where NL represents non-linear). At this point, the gain of the output stage amplifier 18 rapidly expands and then contracts. This gain response is much more realistic than that shown in FIG. 2B, as it reflects a non-ideal operating scenario that is often experienced in the real world. In an effort to compensate the gain response of the output stage amplifier 18, the gain response of the driver stage amplifier 16 is adjusted by the distortion compensation circuitry 20 such that the gain response of the driver stage amplifier 16 is equal but opposite to that of the output stage amplifier 18 during the portion of non-linearity between $P_{NL}$ and $P_{MAX}$, as shown in FIG. 4A. Accordingly, the non-linear portions of the gain response of each one of the driver stage amplifier 16 and the output stage amplifier 18 cancel, resulting in an overall gain response of the conventional RF PA 10 that is linear. Although FIGS. 4A and 4B are discussed with respect to the gain of the driver stage amplifier 16 and the output stage amplifier 18, these graphs could also represent non-linear phase responses of the respective amplifiers, in which case the distortion compensation circuitry 20 would adjust a desired phase shift of the phase shifter 22 in lieu of the gain response of the driver stage amplifier 16.

While generally effective at normalizing the overall gain or phase response of the conventional RF PA 10, the non-linear gain (or phase) response of each one of the driver stage amplifier 16 and the output stage amplifier 18 results in significant up-conversion and down-conversion of noise present in the conventional RF PA 10 (as represented by noise sources N1 through N4). Accordingly, the overall noise response of the conventional RF PA 10 is shown in FIG. 4C, and includes significant peaking between $P_{NL}$ and $P_{MAX}$.

The reason for the increase in noise due to non-linearities in the driver stage amplifier 16 and the output stage amplifier 18 is now discussed with respect to FIG. 5. As shown in FIG. 5, some level of noise is inherently present in the conventional RF PA 10. Specifically, the noise response of the conventional RF PA 10 has relatively high amplitude at low frequencies, which quickly declines as the frequency increases. Due to non-linearities in the gain response of the driver stage amplifier 16 and the output stage amplifier 18, noise at various multiples of the RF frequency of interest ($f_{RF}$—the frequency of the RF signal being amplified by the driver stage amplifier 16 or the output stage amplifier 18) plus or minus a certain frequency offset ($\Delta f$) is either up-converted or down-converted to the RF frequency of interest $f_{RF}$ plus the frequency offset $\Delta f$, thereby resulting in a noise peak. For example, noise present at harmonics of the RF frequency of interest $f_{RF}+\Delta f$ such as $(2n)f_{RF}+\Delta f$ and $(2n+1)f_{RF}+\Delta f$ is down-converted, while noise at one or more lower frequencies is up-converted, resulting in the noise peak shown at the RF frequency of interest $f_{RF}+\Delta f$. The noise peaking discussed above can lead to failure of the conventional RF PA 10 to meet various operational requirements, for example, mandated by one or more wireless communications standards. On example of this is the noise generated by a PA transmitter in a receive band (where $f_{Tx}=f_{RF}$ and $f_{RX}=f_{RF}+\Delta f$.

Accordingly, there is a present need for low noise and high linearity RF PAs including RF PAs with one or more distortion correction or linearization feedback loops.

SUMMARY

The present disclosure relates to radio frequency (RF) power amplifiers (PAs), and specifically to RF PAs including noise reduction feedback linearization circuitry. In one embodiment, RF PA circuitry includes an RF signal path, an adjustable component, a distortion compensation feedback loop including distortion compensation circuitry, RF noise filtering circuitry, and baseband noise filtering circuitry. The RF signal path is coupled between an RF input node and an RF output node. The adjustable component is located in the RF signal path. The distortion compensation feedback loop is coupled in parallel with at least a portion of the RF signal path, and includes the distortion compensation circuitry. Further, the distortion compensation circuitry is configured to adjust one or more parameters of the adjustable component via a component adjustment signal, which is based on a measurement of a signal at the RF output node. The RF noise filtering circuitry is coupled in the RF signal path and configured to attenuate noise therein. The baseband noise filtering circuitry is coupled between the distortion compensation circuitry and the adjustable component and configured to attenuate noise in the component adjustment signal. By including the RF noise filtering circuitry and the baseband filtering circuitry together, the noise in the RF PA circuitry can be significantly reduced while simultaneously utilizing the distortion compensation feedback loop and the distortion compensation circuitry. Accordingly, the performance of the RF PA circuitry can be improved.

In one embodiment, the adjustable component is a variable gain amplifier. The distortion compensation circuitry may be configured to adjust a degeneration resistance of the variable gain amplifier such that the gain response of the variable gain amplifier is relatively linear with respect to the component adjustment signal. Accordingly, noise in the RF PA circuitry due to up-conversion and down-conversion of noise may be reduced, thereby improving the performance of the RF PA circuitry.

In one embodiment, the adjustable component is an adjustable phase shifter. Specifically, the adjustable phase shifter may include multiple phase shifters each coupled in parallel between the RF signal path and a different offset voltage. The distortion compensation circuitry may simultaneously adjust each one of the multiple phase shifters together in order to achieve a desired phase response. Accordingly, the phase response of the adjustable phase shifter may be relatively constant with respect to the component adjustment signal, thereby reducing noise in the RF PA circuitry due to up-conversion and down-conversion of noise therein and improving the performance of the circuitry.

In one embodiment, RF PA circuitry includes an RF signal path, a first adjustable component, a second adjustable component, and a distortion compensation feedback loop including distortion compensation circuitry. The RF signal path is coupled between an RF input node and an RF output node. The first adjustable component and the second adjustable component are located in the RF signal path. The distortion compensation feedback loop is coupled in parallel with at least a portion of the RF signal path, and includes the distortion compensation circuitry. Further, the distortion compensation circuitry is configured to independently adjust one or more parameters of the first adjustable component and the second adjustable component via respective component adjustment signals based on a measurement of a signal at the RF output node. By including multiple adjustable components and independently adjusting them, noise in the RF PA circuitry due to up-conversion and down-conversion thereof can be significantly reduced, thereby improving the performance of the RF PA circuitry.

Noise up-conversion and down-conversion varies with the point in the signal path where distortion compensation is applied. Noise folding is more pronounced at large power levels when stages have larger levels of non-linearity. By using a dual path control loop in which the distortion compensation at low and mid power levels is done at the points with high noise folding gain and the linearization at high power is done at the low noise folding gain, the overall noise performance of the RF PA circuitry is improved.

In one embodiment, the first adjustable component and the second adjustable component are separated by at least an additional component in the RF signal path. Accordingly, dual-path control is achieved by the distortion compensation circuitry, thereby reducing noise in the RF PA circuitry.

In one embodiment, the distortion compensation circuitry includes amplitude modulation (AM) distortion compensation circuitry and phase modulation (PM) distortion compensation circuitry. The first adjustable component may be a variable gain amplifier, while the second adjustable component may be an adjustable phase shifter. Further, a first component adjustment signal may be delivered to the first adjustable component to adjust one or more parameters thereof, while a second component adjustment signal may be delivered to the second adjustable component to adjust one or more parameters thereof. The first component adjustment signal and the second adjustable component signal may be delivered to separate points in the RF signal path, thereby preventing cross-coupling of noise and thereby improving the performance of the RF PA circuitry. Additionally, the first component adjustment signal may be delivered to a common point in the RF signal path via a first isolation impedance and the second component adjustment signal may be delivered to the common point via a second isolation impedance to prevent cross-coupling. The first isolation impedance may be an inductance, while the second isolation impedance may be a capacitance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 5 is a graph illustrating the noise peaking experienced by conventional RF PAs.

FIGS. 6A through 6C are schematics illustrating noise filtering solutions for RF PAs according to one embodiment of the present disclosure.

DETAILED DESCRIPTION

Figure 1:
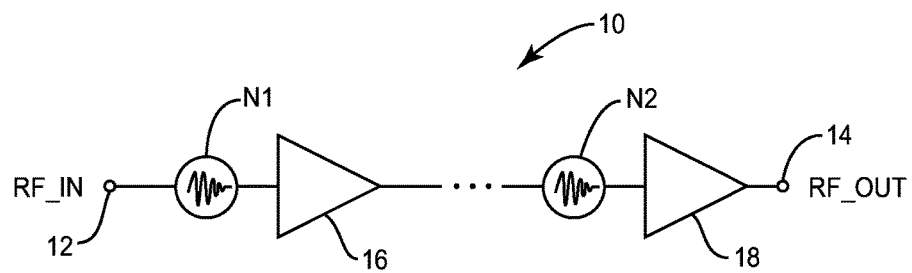
FIG. 1 is a schematic of a conventional radio frequency (RF) power amplifier (PA).
Figure 2A:
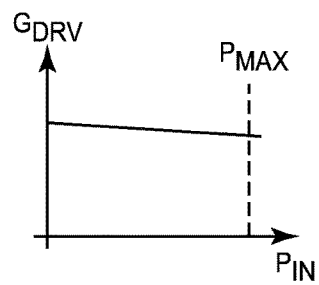
FIGS. 2A through 2C are graphs illustrating the operation of the conventional RF PA shown in FIG. 1.
Figure 2B:
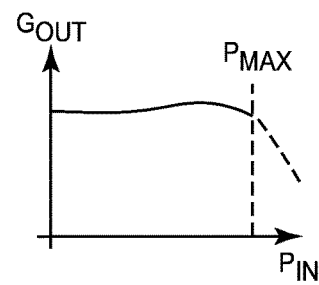
Figure 2C:
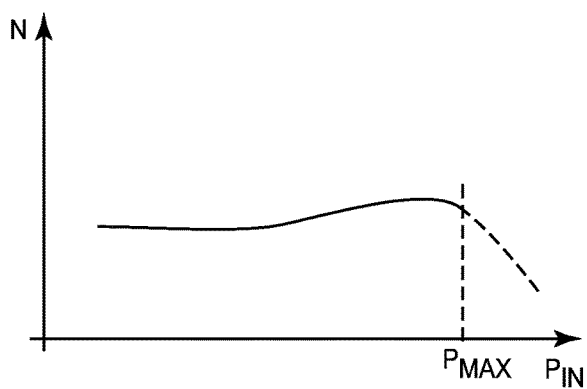
Figure 3:
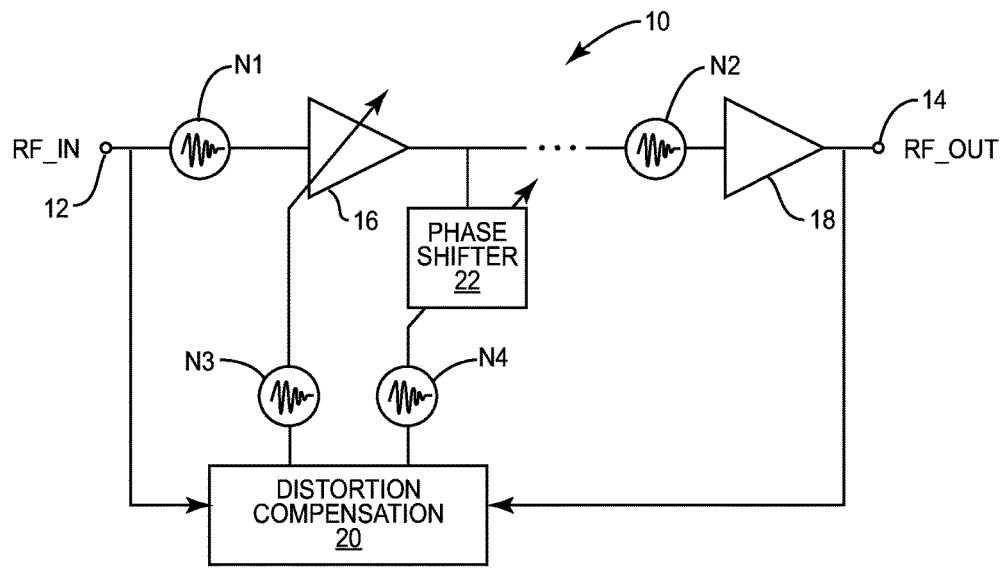
FIG. 3 is a schematic of the conventional RF PA shown in FIG. 1 further including a distortion compensation feedback loop.
Figure 4A:
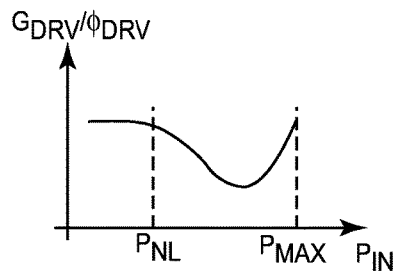
FIGS. 4A through 4C are graphs illustrating the operation of the conventional RF PA shown in FIG. 3.
Figure 4B:
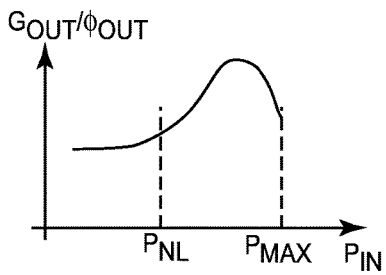
Figure 4C:
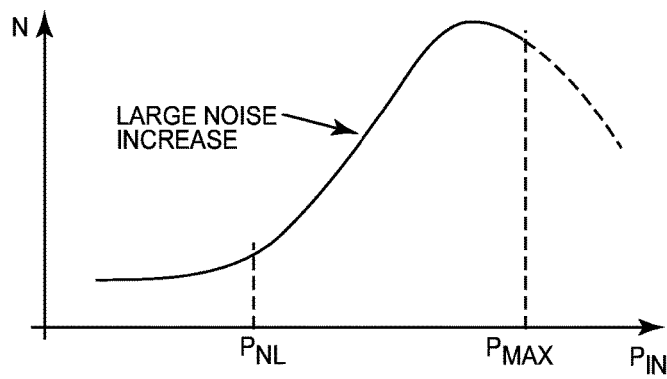

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 6A through 6C show various configurations of a radio frequency (RF) signal path 24 including noise filtering circuitry 26. First, FIG. 6A shows an RF signal path 24 including noise filtering circuitry 26 and an amplifier stage 28. The noise filtering circuitry 26 in this case may be RF noise filtering circuitry such that the noise filtering circuitry 26 attenuates RF noise in the RF signal path 24, as represented by a noise source N_S. The amplifier stage 28 may be a driver stage amplifier, an output stage amplifier, or any other amplifier stage in the RF signal path 24. Further, the amplifier stage 28 may be a variable gain amplifier. By filtering the noise before the non-linear gain stage, noise folding (up-conversion and down-conversion of noise) is significantly reduced. FIG. 6B shows noise filtering circuitry 26 coupled in a control path for the amplifier stage 28 in the RF signal path 24. The noise filtering circuitry 26 in this case may be baseband noise filtering circuitry such that the noise filtering circuitry 26 attenuates baseband noise (represented by the noise source N_S) in the control path for the amplifier stage 28, thereby preventing said noise from entering the RF signal path 24 via frequency translation or direct propagation. FIG. 6C shows noise filtering circuitry 26 in the control path for an adjustable phase shifter 30 coupled to the RF signal path 24. Similar to the noise filtering circuitry 26 in FIG. 6B, the noise filtering circuitry 26 in this case may be baseband noise filtering circuitry such that the noise filtering circuitry 26 attenuates baseband noise (represented by the noise source N_S) in the control path of the adjustable phase shifter 30.

Figure 7:
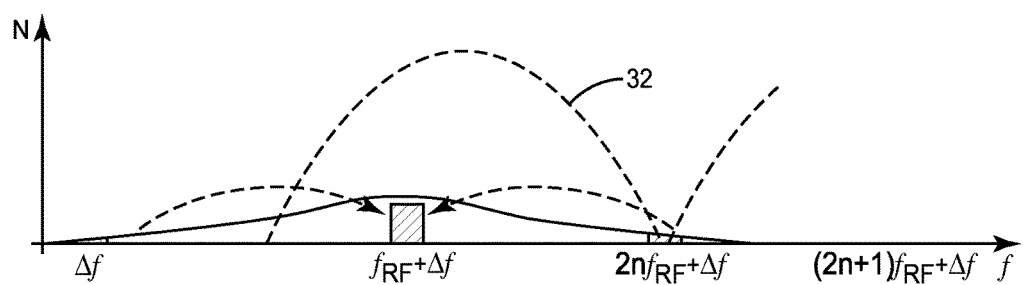
FIG. 7 is a graph illustrating the principles of operation of noise filtering circuitry according to one embodiment of the present disclosure.

FIG. 7 is a graph illustrating the principle of operation of the noise filtering circuitry 26 according to on embodiment of the present disclosure. As shown in FIG. 7, a filter response 32 of the noise filtering circuitry 26 effectively attenuates signals outside of an RF frequency of interest $f_{RF}+\Delta f$. That is, the noise filtering circuitry 26 is effectively a bandpass filter about the RF frequency of interest $f_{RF}+\Delta f$. Accordingly, noise outside of the bandpass response is significantly attenuated, such that the amount of up-conversion and/or down-conversion of noise is reduced. Accordingly, the amount of noise in the RF signal path 24 may be reduced or eliminated altogether such that the RF signal path 24 is capable of meeting one or more performance metrics indicated, for example, by any number of wireless communications standards. Notably, FIG. 7 shows the case in which the noise filtering circuitry 26 is RF filtering circuitry in the RF signal path. The filter response 32 for baseband filtering circuitry located in a control path of the circuitry may be similar, but may be implemented as a low-pass response rather than a bandpass response. Notches may be used in the noise filter to reduce noise at particular frequencies as desired.

Figure 8:
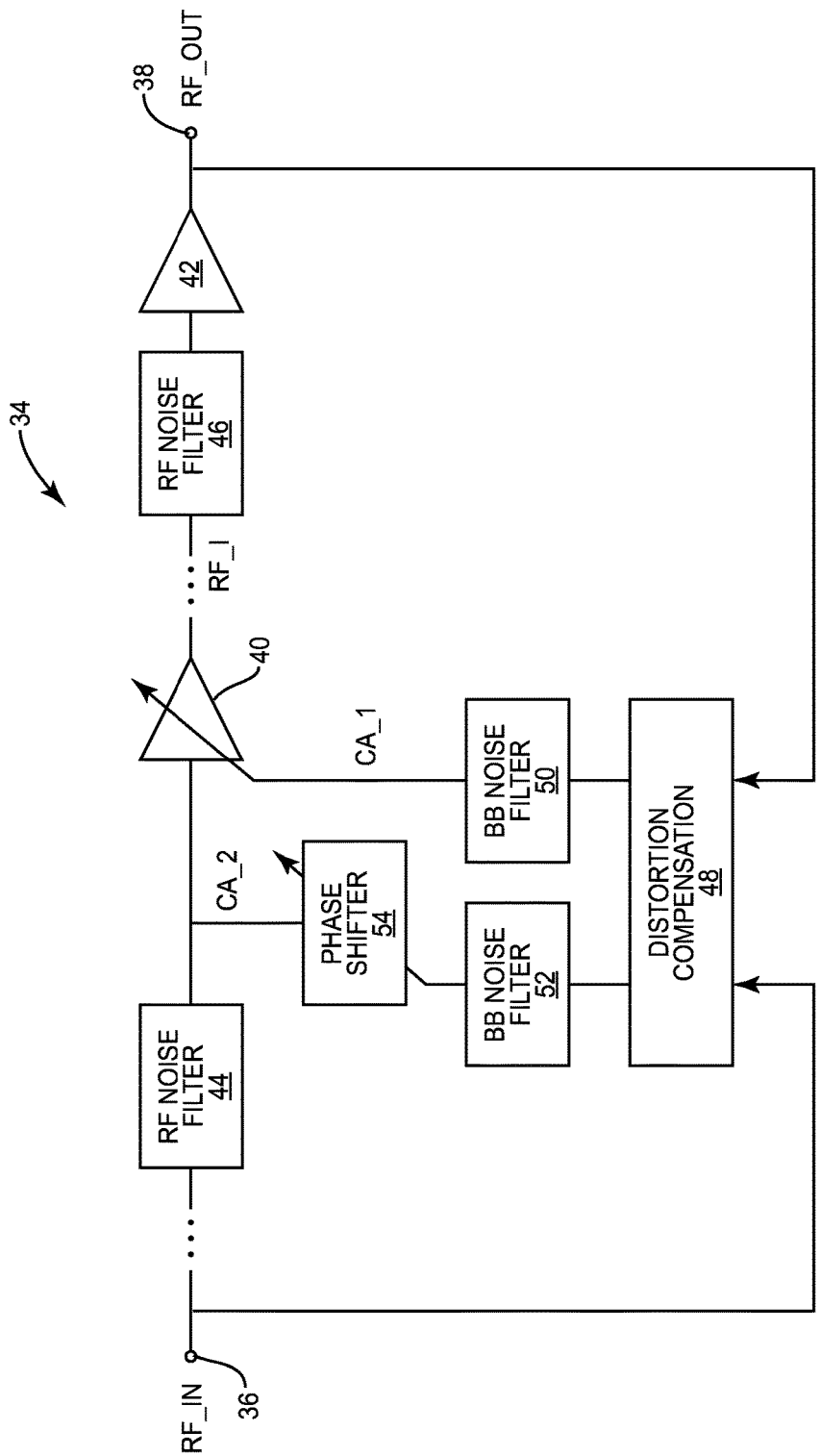
FIG. 8 is a schematic illustrating RF PA circuitry including noise filtering circuitry according to one embodiment of the present disclosure.

FIG. 8 is a schematic illustrating RF PA circuitry 34 according to one embodiment of the present disclosure. The RF PA circuitry 34 includes an RF input node 36, an RF output node 38, a driver stage amplifier 40, an output stage amplifier 42, a first RF noise filter 44, a second RF noise filter 46, distortion compensation circuitry 48, a first baseband noise filter 50, a second baseband noise filter 52, and an adjustable phase shifter 54. The driver stage amplifier 40 and the output stage amplifier 42 are coupled in series in the RF signal path between the RF input node 36 and the RF output node 38. Further, the first RF noise filter 44 precedes the driver stage amplifier 40 in the RF signal path, while the second RF noise filter 46 precedes the output stage amplifier 42 in the RF signal path. The adjustable phase shifter 54 is coupled to the RF signal path before the driver stage amplifier 40. In alternative embodiments, the adjustable phase shifter 54 is coupled before the output stage amplifier 42, or both before the driver stage amplifier 40 and the output stage amplifier 42. The distortion compensation circuitry 48 is coupled to the RF input node 36 and the RF output node 38, such that the distortion compensation circuitry 48 is coupled in either a feedforward or a feedback configuration. The distortion compensation circuitry 48 is also coupled to the driver stage amplifier 40 via the first baseband noise filter 50 and the adjustable phase shifter 54 via the second baseband noise filter 52.

The driver stage amplifier 40 and the output stage amplifier 42 may be implemented in any number of ways, the details of which will be readily understood by those of ordinary skill in the art and thus are omitted from the present disclosure. Similarly, the adjustable phase shifter 54 may also be implemented in any number of ways that will be readily appreciated by those of ordinary skill in the art.

In operation, an RF input signal RF_IN is received at the RF input node 36 and passed to the driver stage amplifier 40 via the first RF noise filter 44 and one or more intermediate amplification stages (not shown). The driver stage amplifier 40 amplifies the RF input signal RF_IN to produce an intermediate RF signal RF_I, which is delivered to the output stage amplifier 42 via the second RF noise filter 46. The output stage amplifier 42 further amplifies the intermediate RF signal RF_I to provide an RF output signal RF_OUT for transmission from an antenna (not shown). The distortion compensation circuitry 48 receives measurements at both the RF input node 36 and the RF output node 38 and provides a first component adjustment signal CA_1 to the driver stage amplifier 40 via the first baseband noise filter 50 and a second component adjustment signal CA_2 to the adjustable phase shifter 54 via the second baseband noise filter 52. Notably, the first component adjustment signal CA_1 adjusts a gain response of the driver stage amplifier 40, which is a variable gain amplifier in the present embodiment, based on a measurement at the RF input node 36, the RF output node 38, or both, in order to linearize the overall gain response of the RF PA circuitry 34. In alternative embodiments, the gain distortion correction can be realized with a controlled attenuator instead of a gain stage. One such example is a resistive divider or a controlled capacitor divider, the details of which will be readily understood by someone of ordinary skill in the art. Similarly, the second component adjustment signal CA_2 adjusts a phase of the adjustable phase shifter based on a measurement at the RF input node 36, the RF output node 38, or both, in order to normalize the overall phase response of the RF PA circuitry 34.

The first RF noise filter 44 and the second RF noise filter 46 effectively attenuate noise in the RF signal path. To do so, the first RF noise filter 44 and the second RF noise filter 46 may be bandpass filters including either a linear or a complex filtering function. The first baseband noise filter 50 and the second baseband noise filter 52 effectively attenuate noise in the control path for the driver stage amplifier 40 and the adjustable phase shifter 54, respectively. To do so, the first baseband noise filter 52 and the second baseband noise filter 54 may be low-pass filters including either a linear or a complex filtering function. By including filters in both the RF signal path and the control paths for the various adjustable components in the RF PA circuitry 34, noise in the circuitry may be significantly reduced, thereby increasing the performance of the RF PA circuitry 34.

While the adjustable components shown in FIG. 8 are the driver stage amplifier 40 and the adjustable phase shifter 54, which is coupled in front of the driver stage amplifier 40, the principles described above may be applied to any number of different configurations of the RF PA circuitry 34 without departing from the principles of the present disclosure. For example, the distortion compensation circuitry 48 may be configured to adjust a gain response of the output stage amplifier 42 or any other intermediate amplification stage, or may be configured to adjust the phase of one or more additional adjustable phase shifters coupled to any number of points in the RF signal path of the RF PA circuitry 34. Further, the distortion compensation circuitry 48 may adjust multiple adjustable components such as the driver stage amplifier 40 and the adjustable phase shifter 54 together in order to simultaneously improve both the overall gain response and phase response of the RF PA circuitry 34. In general, providing noise filtering in both the RF signal path and the control paths for the adjustable components used in the distortion compensation feedback or feedforward loop significantly reduces the overall noise in the RF PA circuitry 34, which leads to an increase in performance.

Figure 9:
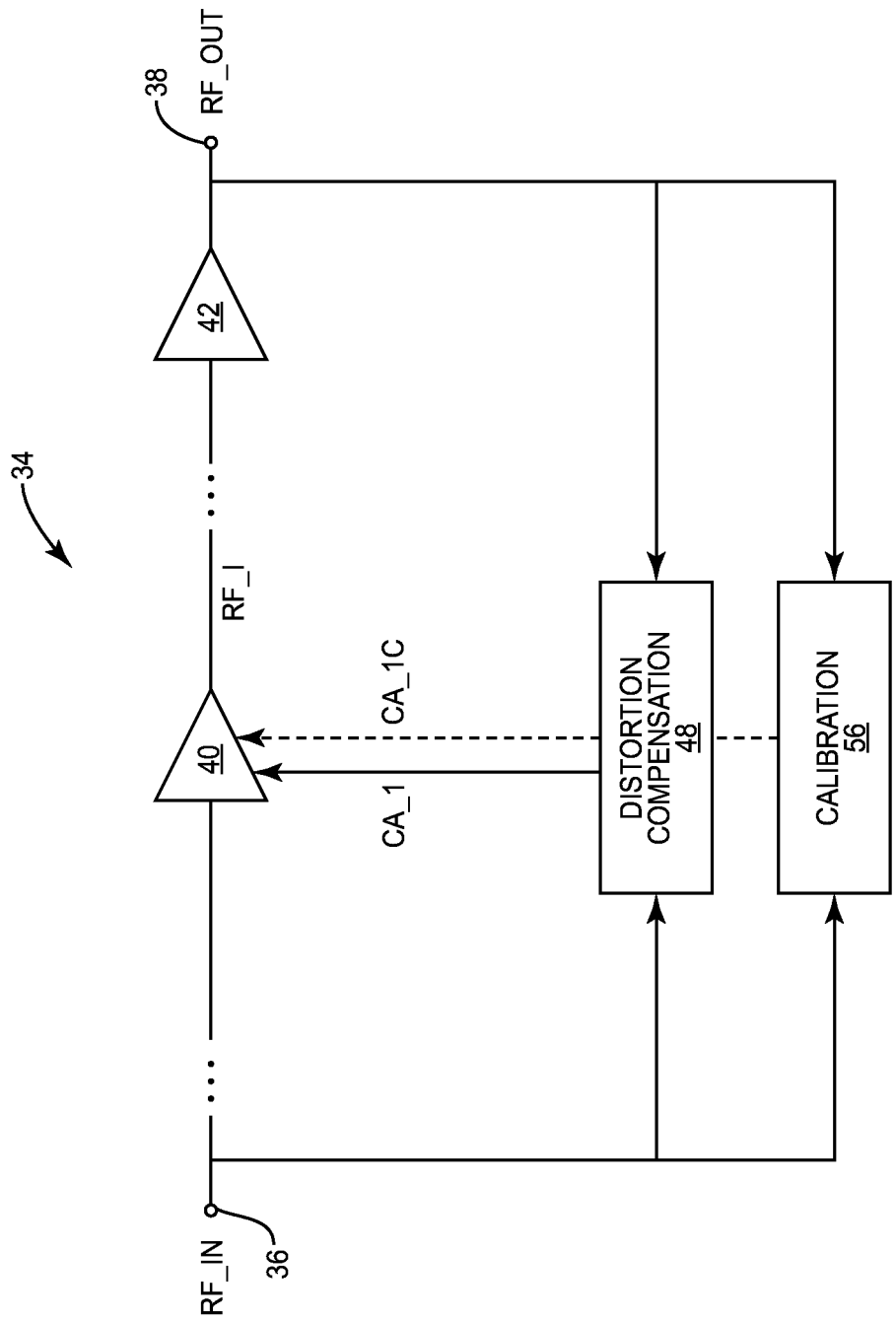
FIG. 9 is a schematic illustrating RF PA circuitry including calibration circuitry according to one embodiment of the present disclosure.

FIG. 9 shows the RF PA circuitry 34 according to an additional embodiment of the present disclosure. The RF PA circuitry 34 shown in FIG. 9 is similar to that shown in FIG. 8, but does not include the first RF noise filter 44, the second RF noise filter 46, the first baseband noise filter 50, the second baseband noise filter 52, or the adjustable phase shifter 54. Further, the RF PA circuitry 34 further includes calibration circuitry 56 coupled in parallel with the distortion compensation circuitry 48. The calibration circuitry 56 is additionally coupled to the driver stage amplifier 40, which is a variable gain amplifier in the present embodiment. The calibration circuitry 56 is configured to adjust the gain response of the driver stage amplifier 40 via a component adjustment calibration signal CA_1C in order to significantly reduce gain variation in the overall gain response of the RF PA circuitry 34, for example, due to one or more low-frequency amplitude modulation (AM) gain distortion sources such as the process of the amplifier stage itself and thermal drift. Notably, the calibration circuitry 56 statically calibrates and sets one or more operating parameters of the driver stage amplifier 40. In other words, the calibration circuitry 56 minimizes non-dynamic sources of variation in the RF PA circuitry 34. During operation, the distortion compensation circuitry 48 operates as described above to reduce or eliminate dynamic sources of distortion in the RF PA circuitry 34, operating on real-time feedback from the RF PA circuitry 34. As discussed in detail below, using the calibration circuitry 56 effectively reduces the amount of adjustment that the distortion compensation circuitry 48 needs to make to linearize the overall gain response of the RF PA circuitry 34. Accordingly, noise in the RF PA circuitry 34 can be significantly reduced due to less up-conversion and down-conversion thereof.

Figure 10:
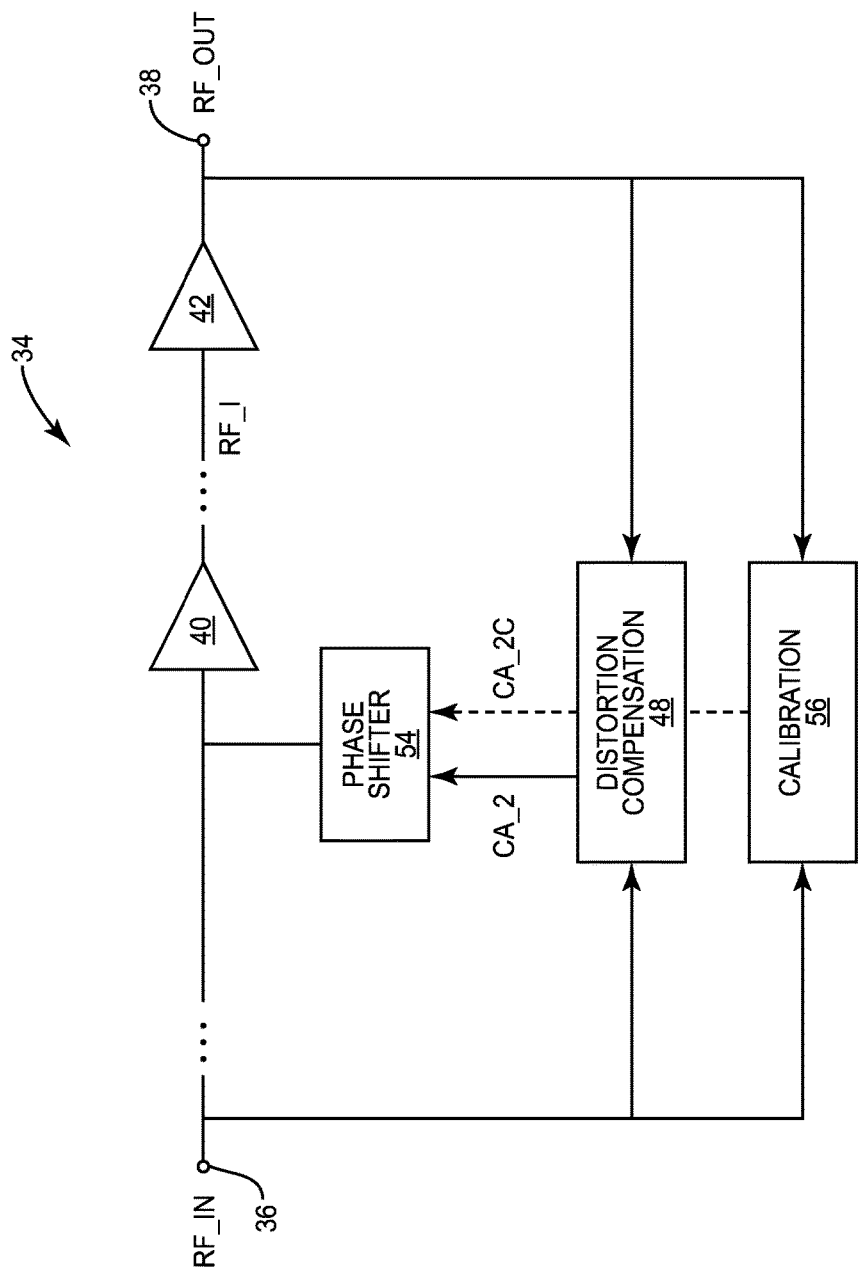
FIG. 10 is a schematic illustrating RF PA circuitry including calibration circuitry according to an additional embodiment of the present disclosure.

FIG. 10 shows the RF PA circuitry 34 according to an additional embodiment of the present disclosure. The RF PA circuitry 34 shown in FIG. 10 is substantially similar to that shown in FIG. 9, except that the distortion compensation circuitry 48 and the calibration circuitry 56 are each coupled to the adjustable phase shifter 54 rather than the driver stage amplifier 40. The operation of the RF PA circuitry 34 is similar to that described above with respect to FIG. 9, except that the distortion compensation circuitry 48 and the calibration circuitry 56 each adjust the phase shift of the adjustable phase shifter 54 rather than the gain response of the driver stage amplifier 40.

Notably, FIGS. 9 and 10 are only exemplary embodiments of the RF PA circuitry 34. That is, the principles of the distortion compensation circuitry along with the calibration circuitry 56 can be applied to any number of adjustable components in the RF signal path of the RF PA circuitry 34 without departing from the principles of the present disclosure. For example, the distortion compensation circuitry 48 and the calibration circuitry 56 may be coupled to the output stage amplifier 42 or any number of intermediate amplifier stages, or may be coupled to an adjustable phase shifter coupled to any number of points in the RF signal path of the RF PA circuitry 34. In general, the calibration circuitry 56 minimizes low-frequency and static sources of distortion in the RF PA circuitry 34, thereby reducing the amount of adjustment required by the distortion compensation circuitry 48. Accordingly, less up-conversion and down-conversion of noise occurs, thereby improving the performance of the RF PA circuitry 34.

Figure 11:
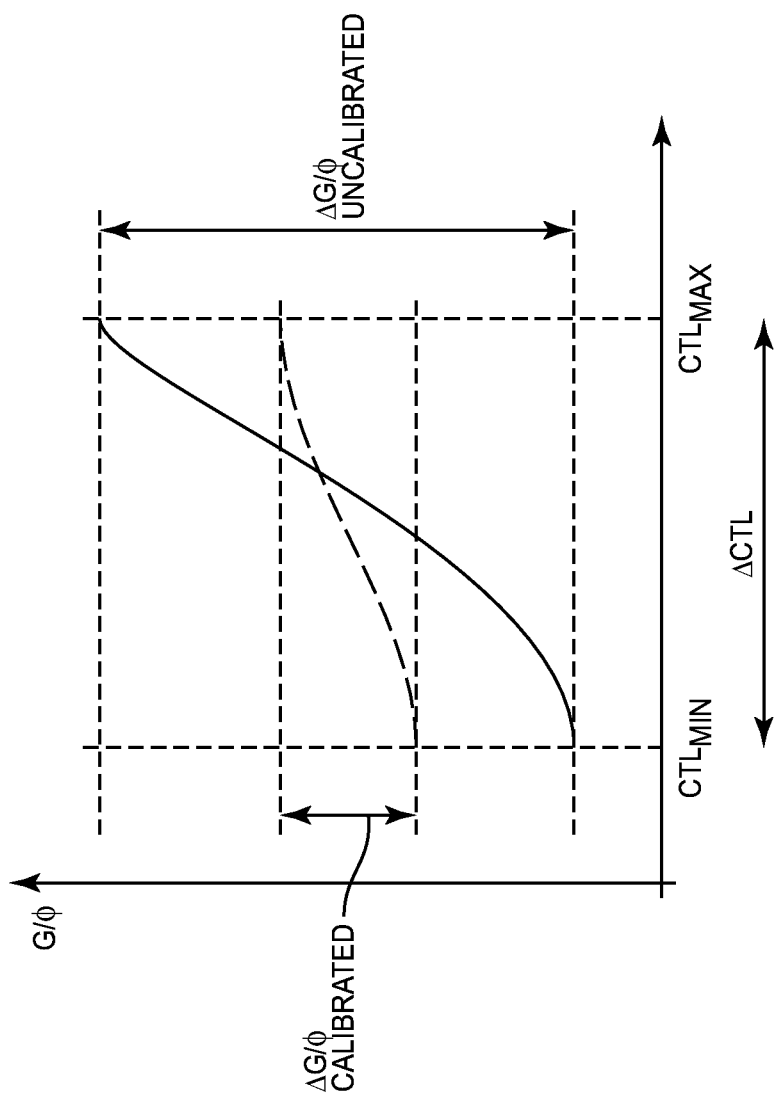
FIG. 11 is a graph illustrating the operation of the calibration circuitry shown in FIGS. 9 and 10 according to one embodiment of the present disclosure.

FIG. 11 is a graph illustrating the operation of the distortion compensation circuitry 48 and the calibration circuitry 56 shown in FIGS. 9 and 10. As shown in FIG. 11, a first gain or phase response illustrated by a solid line changes drastically with changes to a component adjustment signal provided to the adjustable component such as the driver stage amplifier 40 in FIG. 9 or the adjustable phase shifter 54 in FIG. 10. The solid line represents the operation of the RF PA circuitry 34 without the calibration circuitry. The distortion compensation circuitry 48 must drastically change the value of either the gain response or phase response of a component in the RF signal path in order to fully compensate the RF PA circuitry 34 and provide a linear gain response or a constant phase response. Drastically changing a gain or phase response of a component in the RF signal path of the RF PA circuitry 34 results in significant up-conversion and down-conversion of noise, thereby resulting in noise peaks in the circuitry, which reduces performance. In general, a larger control stage $\Delta G/\Delta CTL$ or $\Delta \phi/\Delta CTL$ results in larger noise folding gain due to up-conversion and down-conversion. Accordingly, the calibration circuitry 56 reduces the range over which gain or phase adjustment is required by the distortion compensation circuitry 48, which results in significantly less drastic changes in the gain or phase response of the driver stage amplifier 40 or the adjustable phase shifter 54. As discussed above, the calibration circuitry 56 accomplishes this by setting one or more operating parameters of these adjustable components statically to minimize distortion. The dashed line in FIG. 11 represents the adjustment of a gain or phase response required by the distortion compensation circuitry 48 in conjunction with the calibration circuitry 56. The significantly lower amount of adjustment required by the distortion compensation circuitry 48 means less up-conversion and down-conversion of noise, which leads to an increase in the performance of the RF PA circuitry 34.

Figure 12:
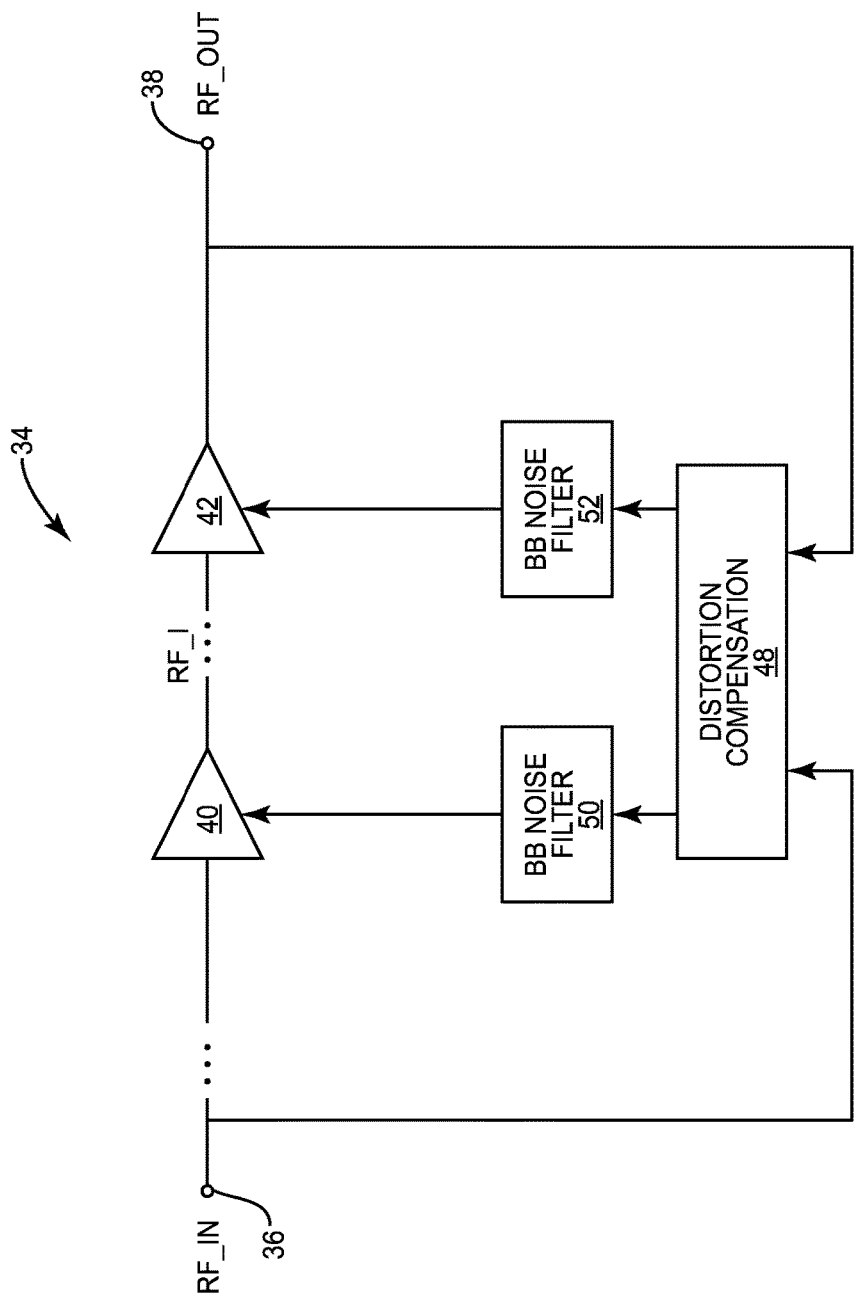
FIG. 12 is a schematic illustrating RF PA circuitry implementing dual-path distortion compensation according to one embodiment of the present disclosure.

FIG. 12 shows the RF PA circuitry 34 according to an additional embodiment of the present disclosure. As shown in FIG. 12, the RF PA circuitry 34 includes the driver stage amplifier 40, the output stage amplifier 42, the first baseband noise filter 50, the second baseband noise filter 52, and the distortion compensation circuitry 48. While the driver stage amplifier 40, the output stage amplifier 42, and the distortion compensation circuitry 48 are coupled as described above, the first baseband noise filter 50 is coupled between the distortion compensation circuitry 48 and the driver stage amplifier 40, while the second baseband noise filter 52 is coupled between the distortion compensation circuitry 48 and the output stage amplifier 42. Notably, the distortion compensation circuitry 48 shown in FIG. 12 operates using dual-path control, which reduces noise in the RF PA circuitry 34 as discussed in detail below.

Figure 13A:
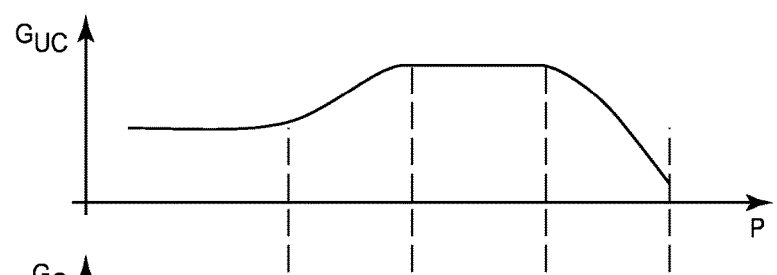
FIGS. 13A through 13D are graphs illustrating operation of the dual-path distortion compensation shown in FIG. 12 according to one embodiment of the present disclosure.
Figure 13B:
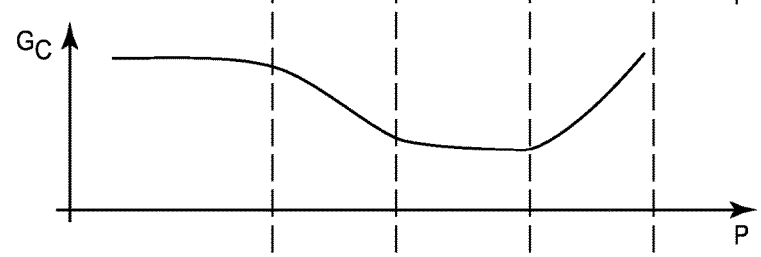
Figure 13C:
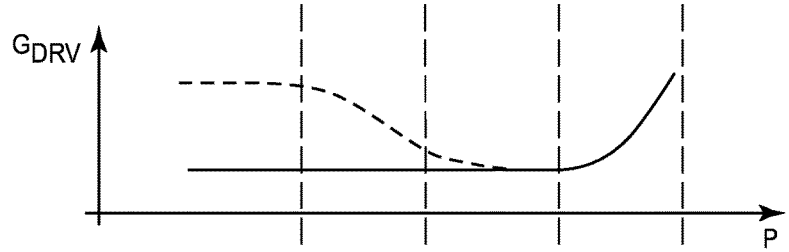
Figure 13D:
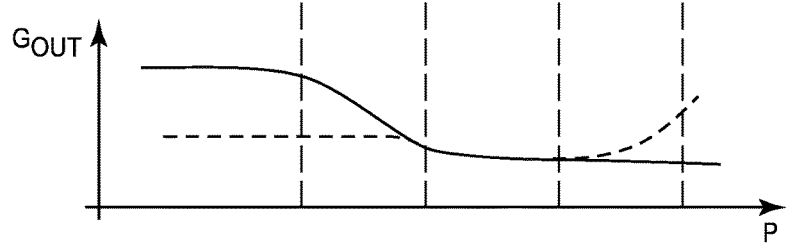

FIGS. 13A through 13D illustrate the operation of the RF PA circuitry 34 shown in FIG. 12 according to one embodiment of the present disclosure. FIG. 13A illustrates the overall gain response of the RF PA circuitry 34 when the circuitry is left uncompensated by the distortion compensation circuitry 48. FIG. 13B illustrates the necessary gain compensation that must be introduced in the RF signal path in order to linearize the overall gain response of the RF PA circuitry 34 shown in FIG. 13A. Notably, the gain response shown in FIG. 13B is equal but opposite to that shown in FIG. 13A during the non-linear portions thereof, such that it will cancel the non-linear portions of the gain response and thereby increase the overall linearity of the RF PA circuitry 34. FIG. 13C shows the gain response of the driver stage amplifier 40, as implemented by the distortion compensation circuitry 48. As shown, the gain response of the driver stage amplifier 40 provides part of the overall gain compensation shown in FIG. 13B. FIG. 13D shows the gain response of the output stage amplifier 42. As shown, the gain response of the output stage amplifier 42 provides the remaining portion of the gain compensation shown in FIG. 13B that is not implemented by the driver stage amplifier 40. In general, the gain compensation for the RF PA circuitry 34 is split between a number of adjustable components such as the driver stage amplifier 40 and the output stage amplifier 42. The precise split of the gain compensation can be determined based on the uncompensated gain response of the RF PA circuitry 34 in order to minimize the amount of correction necessary for each stage. Generally, the output stage amplifier 42 will suffer from a larger amount of nonlinearity than the other amplifier stages in the RF PA circuitry 34. Accordingly, the majority of the gain compensation may be provided in the driver stage amplifier 40 in order to minimize the amount of gain adjustment provided by the output stage amplifier 42, which has a larger noise folding gain, and thus reduce the up-conversion and down-conversion of noise in the RF signal path. As such the driver stage amplifier 40 provides most or all of the correction at high power when noise folding is high, while the output stage provides correction at lower power and optional partial correction at high power.

Figure 14A:
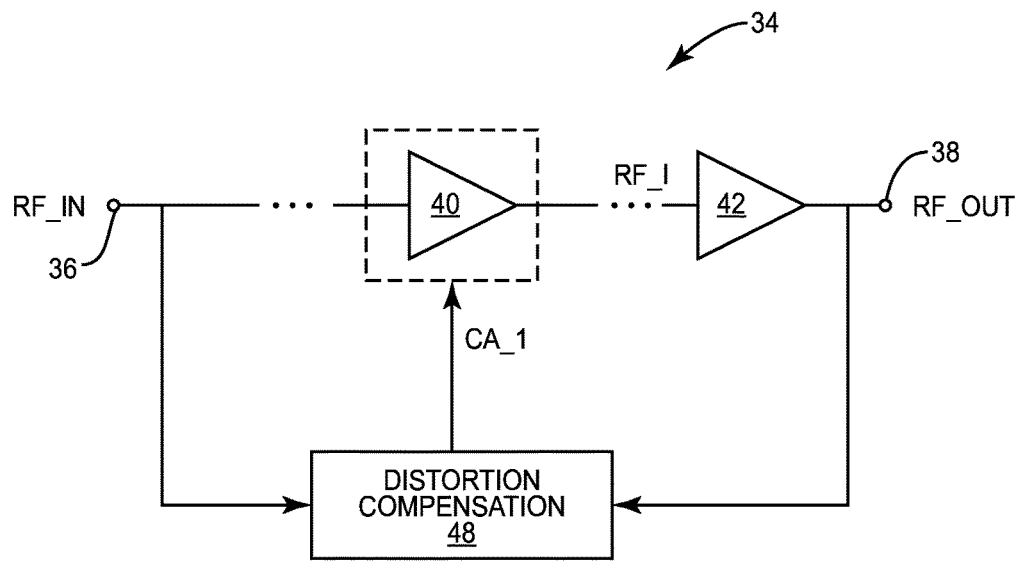
FIGS. 14A and 14B are a schematics illustrating distortion compensation using a high linearity variable gain amplifier according to one embodiment of the present disclosure.
Figure 14B:
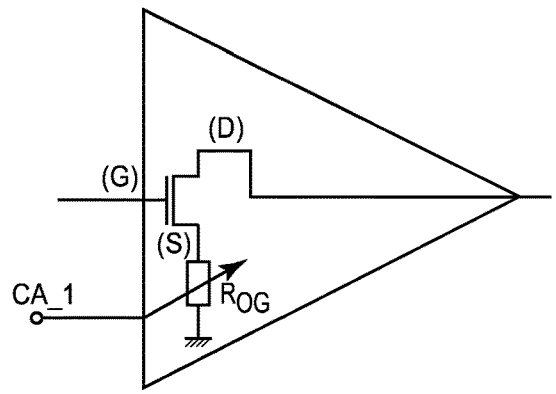
Figure 15:
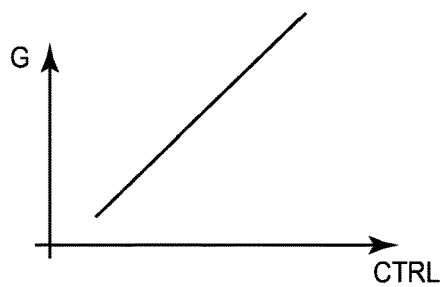
FIG. 15 is a graph illustrating the operation of the high linearity variable gain amplifier according to one embodiment of the present disclosure.

FIG. 14A shows the RF PA circuitry 34 according to an additional embodiment of the present disclosure. As shown in FIG. 14A, the RF PA circuitry 34 includes the driver stage amplifier 40, the output stage amplifier 42, and the distortion compensation circuitry 48. In the embodiment shown in FIG. 14A, the driver stage amplifier 40 is a high linearity variable gain amplifier, as represented by the dashed box surrounding the device. FIG. 14B shows details of the driver stage amplifier 40 in this embodiment. These details are exemplary only and are not intended to limit the scope of the present disclosure. As shown in FIG. 14B, the driver stage amplifier 40 is a transistor including a gate contact (G) a drain contact (D) and a source contact (S). The gate contact (G) acts as an input to the driver stage amplifier 40, while the drain contact (D) acts as an output to the driver stage amplifier 40. The source contact (S) is coupled to ground via a degeneration impedance $R_{DG}$, which is adjusted by a component adjustment signal CA_1 delivered from the distortion compensation circuitry 48. By adjusting the gain of the driver stage amplifier 40 using the degeneration impedance $R_{DG}$, the gain response of the driver stage amplifier 40 with respect to the component adjustment signal CA_1 can be kept substantially linear, as shown in FIG. 15. Accordingly, up-conversion and down-conversion of noise in the RF signal path is reduced, thereby improving the performance of the RF PA circuitry 34. While the transistor shown in FIG. 14B is a metal-oxide-semiconductor field-effect transistor (MOSFET), the transistor may similarly be a bipolar junction transistor (BJT), a high electron mobility transistor (HEMT), or any other type of amplification device without departing from the principles of the present disclosure.

Figure 16A:
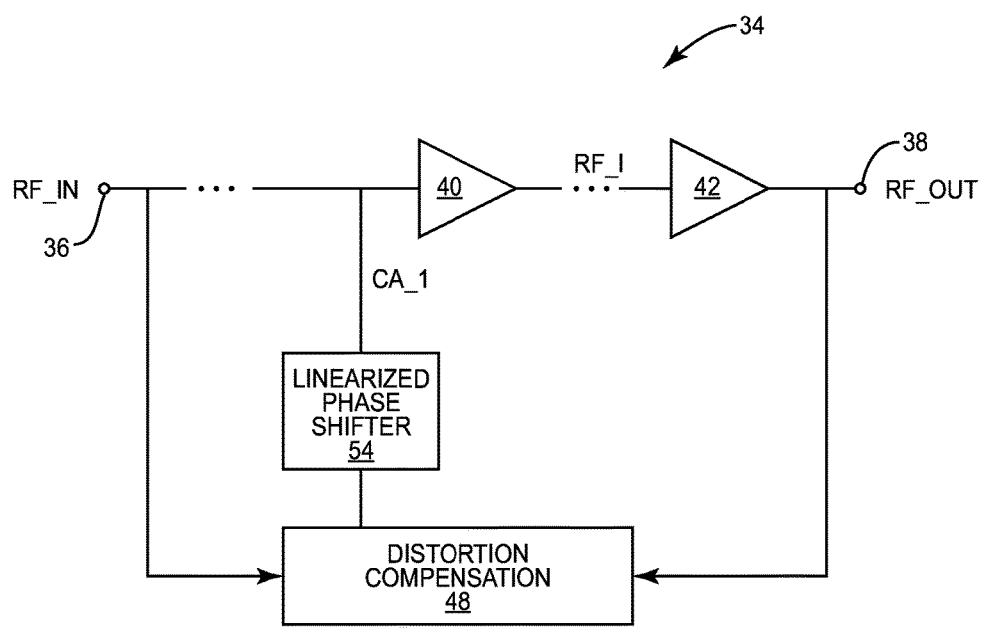
FIGS. 16A and 16B are schematics illustrating distortion compensation using a high linearity phase shifter according to one embodiment of the present disclosure.
Figure 16B:
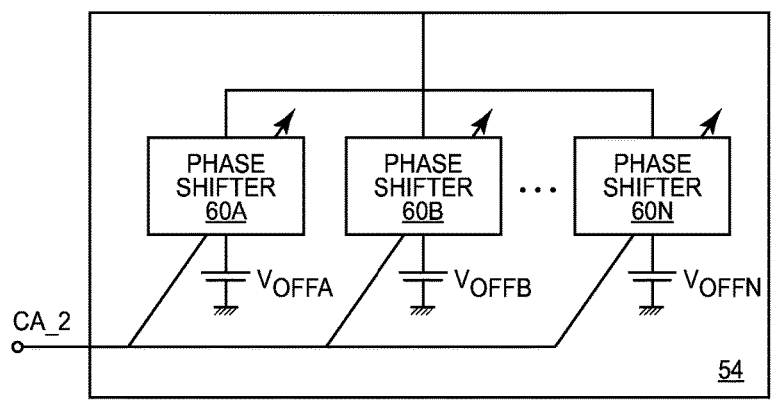

FIG. 16A shows the RF PA circuitry 34 according to an additional embodiment of the present disclosure. The RF PA circuitry 34 shown in FIG. 16A includes the driver stage amplifier 40, the output stage amplifier 42, the distortion compensation circuitry 48, and the adjustable phase shifter 54. In the embodiment shown in FIG. 16A, the adjustable phase shifter 54 is a high linearity adjustable phase shifter 54. FIG. 16B shows details of the adjustable phase shifter 54 in this embodiment. These details are exemplary only and are not intended to limit the scope of the present disclosure. The adjustable phase shifter 54 includes a number of adjustable phase shifters 60 each coupled in parallel between the RF signal path and a different offset voltage. Specifically shown in FIG. 16B is a first adjustable phase shifter 60A coupled between the RF signal path and a first offset voltage $V_{OFFA}$, a second adjustable phase shifter 60B coupled between the RF signal path and a second offset voltage $V_{OFFB}$, and an $N^{th}$ adjustable phase shifter 60N coupled between the RF signal path and an $N^{th}$ offset voltage $V_{OFFN}$. The adjustable phase shifters 60 may be implemented in any number of different ways, the details of which will be readily appreciated by those of ordinary skill in the art and thus are omitted from the present disclosure.

Figure 17:
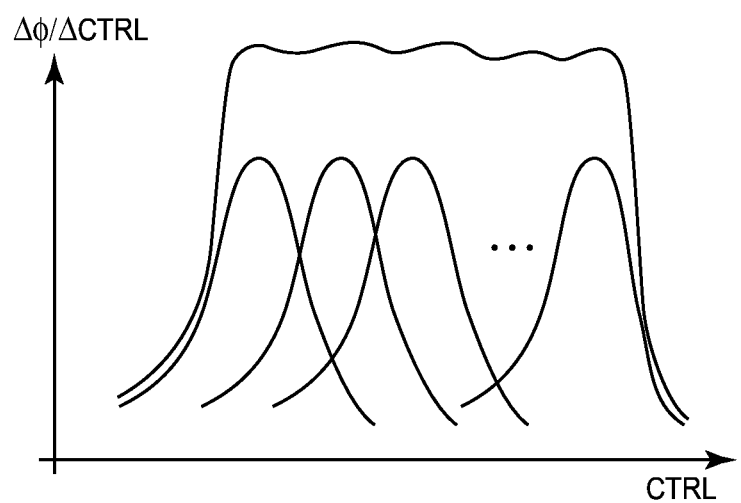
FIG. 17 is a graph illustrating the operation of the high linearity phase shifter according to one embodiment of the present disclosure.

The phase response of the adjustable phase shifter 54 with respect to the component adjustment signal CA_1 used to adjust the adjustable phase shifter is shown in FIG. 17. As shown, the phase response for each one of the adjustable phase shifters 60 are located adjacent to one another and combine to form a desired overall phase response. Distributing the phase response of the adjustable phase shifter 54 using the multiple phase shifters 60 allows for less adjustment of each one of the individual phase shifters 60, thereby leading to less up-conversion and down-conversion of noise and therefore better performance of the RF PA circuitry 34.

Figure 18:
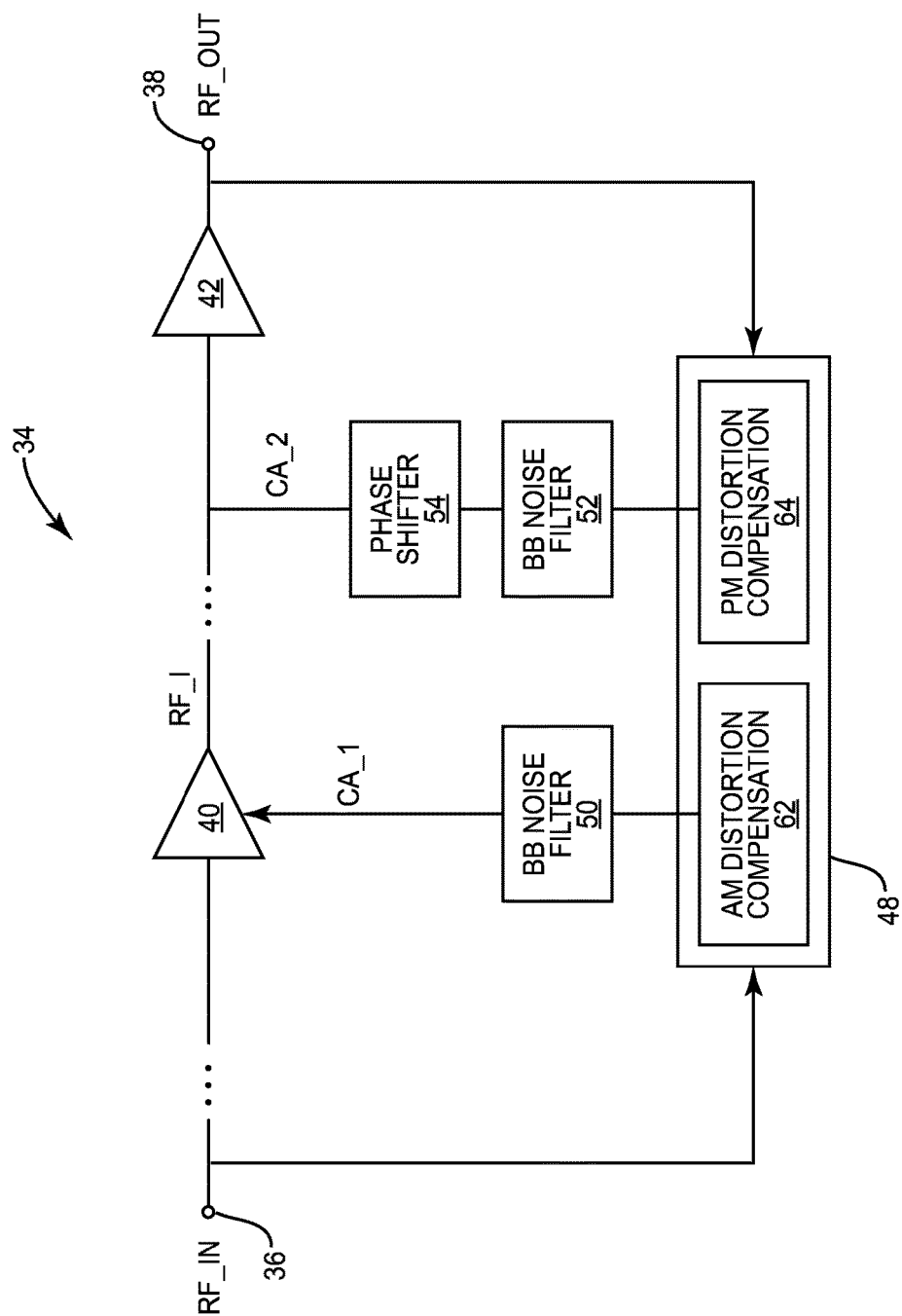
FIG. 18 is a schematic illustrating RF PA circuitry implementing dual-point distortion compensation according to one embodiment of the present disclosure.

FIG. 18 shows the RF PA circuitry 34 according to an additional embodiment of the present disclosure. The RF PA circuitry 34 shown in FIG. 18 includes the driver stage amplifier 40, the output stage amplifier 42, the distortion compensation circuitry 48, the first baseband noise filter 50, the second baseband noise filter 52, and the adjustable phase shifter 54. The distortion compensation circuitry 48 includes AM distortion compensation circuitry 62 and phase modulation (PM) distortion compensation circuitry 64. The AM distortion compensation circuitry 62 is coupled to the driver stage amplifier 40 via the first baseband noise filter 50. The PM distortion compensation circuitry 64 is coupled to the adjustable phase shifter 54 via the second baseband noise filter 52. The adjustable phase shifter 54 is coupled before the output stage amplifier 42 in the RF signal path.

As discussed above, the AM distortion compensation circuitry 62 provides a first component adjustment signal CA_1 to the driver stage amplifier 40 in order to compensate for AM distortion in the RF signal path. Further, the PM distortion compensation circuitry 64 provides a second component adjustment signal CA_2 to the adjustable phase shifter 54 to compensate for PM distortion in the RF signal path. Notably, the first component adjustment signal CA_1 and the second component adjustment signal CA_2 are delivered to separate points in the RF signal path, thereby reducing noise and distortion due to cross-talk between the separate control paths. Designing the RF signal path such that the different control signals are delivered to different points in the RF signal path thus reduces distortion in the RF PA circuitry 34, thereby improving the performance thereof.

Figure 19:
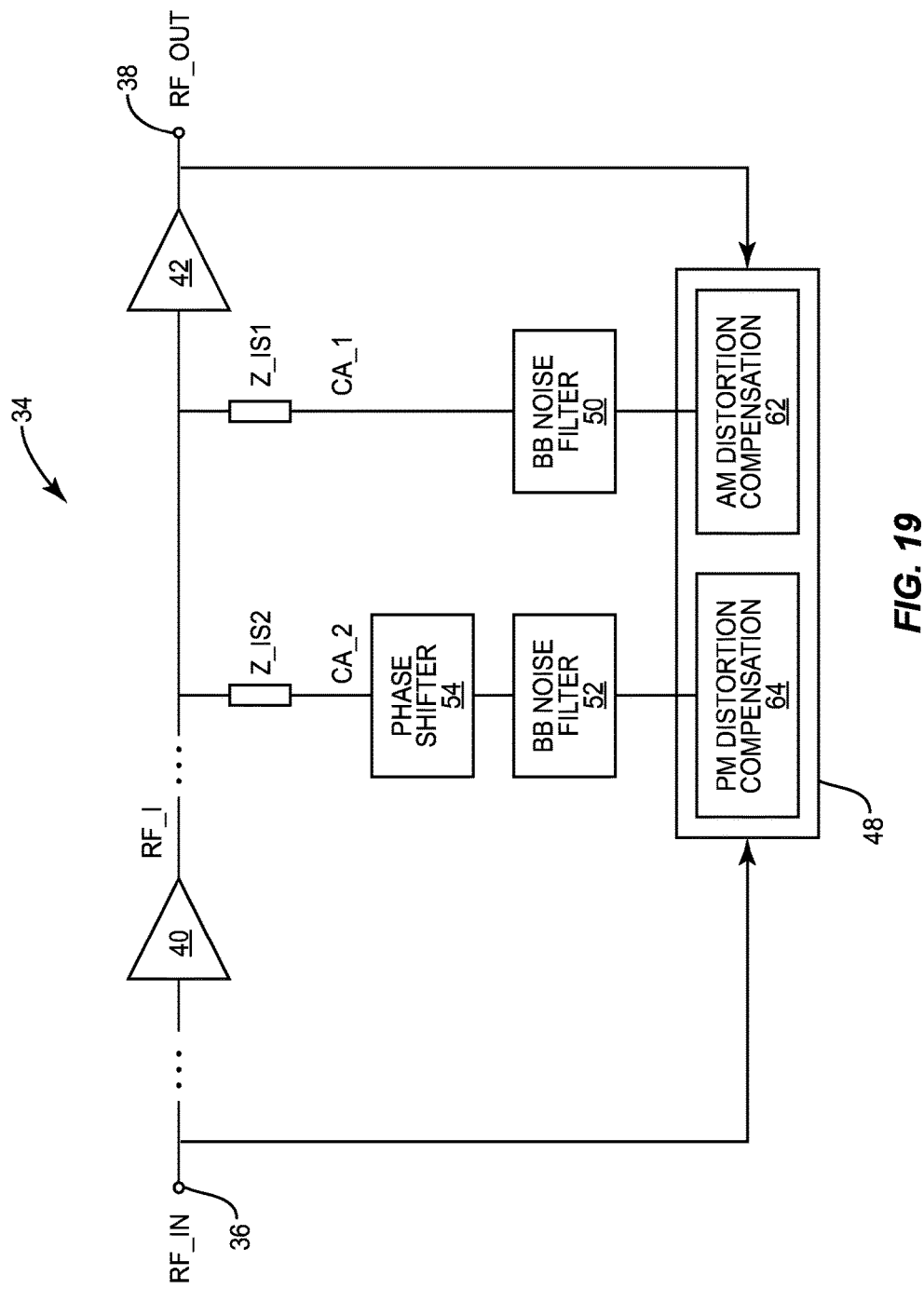
FIG. 19 is a schematic illustrating single-point distortion compensation according to one embodiment of the present disclosure.

In some situations, design constraints for the RF PA circuitry 34 mandate that the control path for multiple adjustable components in the RF signal path are the same, as shown in FIG. 19. The RF PA circuitry 34 shown in FIG. 19 is substantially similar to that shown in FIG. 18, except that the AM distortion compensation circuitry 62 is coupled to an input of the output stage amplifier 42 rather than the driver stage amplifier 40. Further, a first isolation impedance Z_IS1 is coupled between the first baseband noise filter 50 and the input of the output stage amplifier 42, and a second isolation impedance Z_IS2 is coupled between the adjustable phase shifter 54 and the RF signal path. The first isolation impedance Z_IS1 and the second isolation impedance Z_IS2 isolate the respective control paths from the AM distortion compensation circuitry 62 and the PM distortion compensation circuitry 64 to the RF signal path, thereby preventing cross-talk and reducing noise and distortion in the RF PA circuitry 34.

Figure 20:
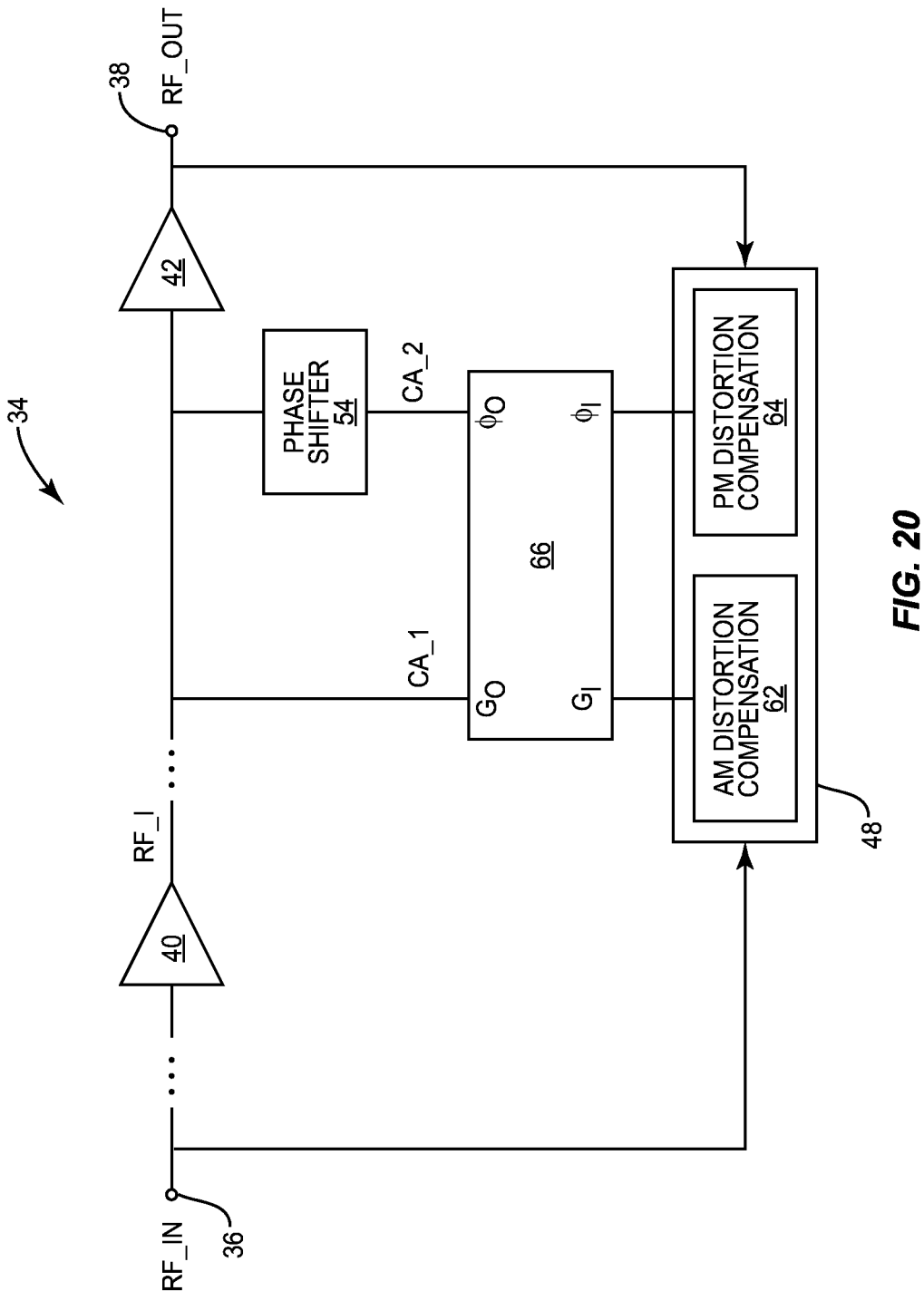
FIG. 20 is a schematic illustrating distortion compensation including complex filtering according to one embodiment of the present disclosure.

FIG. 20 shows the RF PA circuitry 34 according to an additional embodiment of the present disclosure. The RF PA circuitry 34 shown in FIG. 20 includes the driver stage amplifier 40, the output stage amplifier 42, the distortion compensation circuitry 48, and the adjustable phase shifter 54. Further, the RF PA circuitry 34 includes complex filtering circuitry 66. The AM distortion compensation circuitry 62 is coupled to the driver stage amplifier 40 via the complex filtering circuitry 66, while the PM distortion compensation circuitry 64 is coupled to the adjustable phase shifter 54 via the complex filtering circuitry 66. The complex filtering circuitry allows for a low order filter with high filtration, while simultaneously isolating the control paths to the various adjustable components in the RF signal path. The details of the complex filtering circuitry 66 will be appreciated by those of ordinary skill in the art and are therefore omitted from the present disclosure for brevity.

While the AM distortion compensation circuitry 62 and the PM distortion compensation circuitry 64 shown in FIG. 20 are connected to the driver stage amplifier 40 and the adjustable phase shifter 54, the AM distortion compensation circuitry 62 and the PM distortion compensation circuitry 64 may alternatively or additionally be coupled to any number of different adjustable components in the RF signal path, the details of which will be appreciated by those of ordinary skill in the art. For example, the AM distortion compensation circuitry 62 may alternatively or additionally be connected to the output stage amplifier 42 or any number of intermediate amplifier stages without departing from the principles disclosed herein. Further, the PM distortion compensation circuitry 64 may alternatively or additionally be coupled to any number of adjustable phase shifters coupled to any number of points in the RF signal path.

Those skilled in the art will recognize improvements and modifications to the embodiments of the present disclosure. All such improvements and modifications are considered within the scope of the concepts disclosed herein and the claims that follow.

What is claimed is:

1. Radio frequency (RF) power amplifier (PA) circuitry comprising:
   an RF signal path coupled between an RF input node and an RF output node;
   an adjustable component coupled in the RF signal path;
   a distortion compensation feedback loop coupled in parallel with at least a portion of the RF signal path;
   distortion compensation circuitry coupled in the distortion compensation feedback loop and configured to adjust one or more parameters of the adjustable component via a component adjustment signal based on a measurement of a signal at the RF output node;
   RF noise filtering circuitry coupled in the RF signal path and configured to attenuate noise in the RF signal path; and
   baseband noise filtering circuitry coupled between the distortion compensation circuitry and the adjustable component and configured to attenuate noise in the component adjustment signal.

2. The RF PA circuitry of claim 1 wherein the adjustable component is a variable attenuator.

3. The RF PA circuitry of claim 1 wherein the adjustable component is a variable gain amplifier.

4. The RF PA circuitry of claim 3 wherein the distortion compensation circuitry is configured to adjust a degeneration resistance of the variable gain amplifier.

5. The RF PA circuitry of claim 1 wherein the RF PA circuitry comprises multiple adjustable components coupled in the RF signal path such that there are multiple variable gain components coupled in the RF signal path.

6. The RF PA circuitry of claim 1 wherein the adjustable component is an adjustable phase shifter.

7. The RF PA circuitry of claim 6 wherein the adjustable phase shifter comprises multiple phase shifters each coupled in parallel between the RF signal path and a different offset voltage.

8. The RF PA circuitry of claim 7 wherein the distortion compensation circuitry is configured to adjust each one of the multiple phase shifters together.

9. The RF PA circuitry of claim 1 wherein the distortion compensation feedback loop is additionally a feedforward loop such that the distortion compensation circuitry is additionally configured to adjust one or more parameters of the adjustable component based on a measurement of a signal at the RF input node.

10. The RF PA circuitry of claim 1 further comprising calibration circuitry that reduces a control range of the distortion compensation circuitry.

11. The RF PA circuitry of claim 10 wherein the calibration circuitry reduces low-frequency gain variation in the RF PA circuitry such that a gain adjustment range of the distortion compensation circuitry is reduced.

12. The RF PA circuitry of claim 10 wherein the calibration circuitry reduces low-frequency phase variation in the RF PA circuitry such that a phase adjustment range of the distortion compensation circuitry is reduced.

13. Radio frequency (RF) power amplifier (PA) circuitry comprising:
   an RF signal path coupled between an RF input node and an RF output node;
   a first adjustable component coupled in the RF signal path;
   a second adjustable component coupled in the RF signal path;
   a distortion compensation feedback loop coupled in parallel with at least a portion of the RF signal path; and
   distortion compensation circuitry coupled in the distortion compensation feedback loop and configured to independently adjust one or more parameters of the first adjustable component and the second adjustable component via a first component adjustment signal and a second component adjustment signal, respectively, based on a measurement of a signal at the RF output node; and
   baseband noise filtering circuitry coupled between the distortion compensation circuitry, the first adjustable component, and the second adjustable component and configured to attenuate noise in the first component adjustment signal and the second component adjustment signal.

14. The RF PA circuitry of claim 13 wherein the first adjustable component and the second adjustable component are separated by at least an additional component in the RF signal path.

15. The RF PA circuitry of claim 14 wherein the adjustable phase shifter comprises multiple phase shifters each coupled in parallel between the RF signal path and a different offset voltage.

16. The RF PA circuitry of claim 15 wherein the distortion compensation circuitry is configured to adjust each one of the multiple phase shifters together.

17. The RF PA circuitry of claim 13 wherein at least one of the first adjustable component and the second adjustable component is a variable gain amplifier.

18. The RF PA circuitry of claim 17 wherein the distortion compensation circuitry is configured to adjust a degeneration resistance of the variable gain amplifier.

19. The RF PA circuitry of claim 13 wherein at least one of the first adjustable component and the second adjustable component is an adjustable phase shifter.

20. The RF PA circuitry of claim 13 wherein the distortion compensation feedback loop is additionally a feedforward loop such that the distortion compensation circuitry is additionally configured to adjust the one or more parameters of the first adjustable component and the second adjustable component based on a measurement of a signal at the RF input node.

21. The RF PA circuitry of claim 13 wherein the distortion compensation circuitry comprises amplitude modulation (AM) distortion compensation circuitry and phase modulation (PM) distortion compensation circuitry.

22. The RF PA circuitry of claim 21 wherein the AM distortion compensation circuitry is configured to adjust the first adjustable component via the first component adjustment signal and the PM distortion compensation circuitry is configured to adjust the second adjustable component via the second component adjustment signal.

23. The RF PA circuitry of claim 22 wherein the first adjustable component is a variable gain amplifier and the second adjustable component is an adjustable phase shifter.

24. The RF PA circuitry of claim 22 wherein the first component adjustment signal and the second component adjustment signal are delivered to separate points in the RF signal path.

25. The RF PA circuitry of claim 22 wherein the first component adjustment signal is delivered to a common adjustment node in the RF signal path via a first isolation impedance and the second component adjustment signal is delivered to the common adjustment node via a second isolation impedance.

26. The RF PA circuitry of claim 25 wherein the first isolation impedance is an inductance and the second isolation impedance is a capacitance.

27. The RF PA circuitry of claim 22 wherein the first component adjustment signal and the second component adjustment signal are delivered to the first adjustable component and the second adjustable component, respectively, via a complex filtering network.

28. The RF PA circuitry of claim 27 wherein the complex filtering network compensates for cross-coupling between a control path from the AM distortion compensation circuitry to the first adjustable component and a control path from the PM distortion compensation circuitry to the second adjustable component.

* * * * *